US 6,524,972 B1

(12) United States Patent
Maeda

(10) Patent No.: US 6,524,972 B1
(45) Date of Patent: Feb. 25, 2003

(54) METHOD FOR FORMING AN INTERLAYER INSULATING FILM, AND SEMICONDUCTOR DEVICE

(75) Inventor: Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/521,843

(22) Filed: Mar. 9, 2000

(30) Foreign Application Priority Data

Mar. 17, 1999 (JP) .......................... 11-072245
Jan. 18, 2000 (JP) ........................ 2000-009419

(51) Int. Cl.[7] ........................................... H01L 21/469
(52) U.S. Cl. ..................... 438/778; 438/787; 438/790; 438/960
(58) Field of Search ............................. 438/778, 787, 438/790, 960

(56) References Cited

U.S. PATENT DOCUMENTS

| 4,104,090 A | 8/1978 | Pogge ........................ 438/409 |
| 5,614,270 A | 3/1997 | Yeh et al. | |
| 5,726,090 A | 3/1998 | Jang et al. | |
| 6,149,987 A | * 11/2000 | Perng et al. ................ 427/579 |
| 6,153,528 A | * 11/2000 | Lan ............................ 438/697 |

FOREIGN PATENT DOCUMENTS

| EP | 435161 | 7/1991 |
| EP | 678913 | 10/1995 |
| EP | 881678 | 12/1998 |
| EP | 939433 | * 9/1999 |
| GB | 2 298 658 A | 11/1996 |
| JP | 09-74090 | 3/1997 |
| JP | 09-205140 | 8/1997 |
| JP | 09-266207 | 10/1997 |
| JP | 09-275103 | 10/1997 |
| JP | 10-92808 | 4/1998 |
| WO | 98-50945 | 11/1998 |

\* cited by examiner

Primary Examiner—Trung Dang
(74) Attorney, Agent, or Firm—Lorusso & Loud

(57) ABSTRACT

A method for forming an interlayer insulating film is disclosed. This method comprises the steps of: forming an underlying insulating film on an object to be formed; and forming a porous $SiO_2$ film on said underlying insulating film by a Chemical Vapor Deposition that employs a source gas containing TEOS (tetraethoxy silane) and $O_3$ where the $O_3$ is contained in the source gas with first concentration that is lower than concentration necessary for oxidizing the TEOS.

Alternative method for forming an interlayer insulating film is also disclosed. This method comprises the step of: forming an underlying insulating film on an object to be formed; performing Cl (chlorine) plasma treatment for the underlying insulating film; and forming a porous $SiO_2$ film on the underlying insulating film by a Chemical Vapor Deposition that employs a source gas containing TEOS (tetraethoxy silane) and $O_3$.

19 Claims, 12 Drawing Sheets

Cl (Chlorine) Plasma Treatment

METHOD FOR FORMING AN INTERLAYER INSULATING FILM, AND SEMICONDUCTOR DEVICE

BACKGROUND OF THE INVENTION

The present invention relates to a method for forming an interlayer insulating film and, more particularly, to a method for forming an interlayer insulating film having a low dielectric constant, which is necessary for a highly-integrated semiconductor device. A progress in high integration regarding the semiconductor device in recent years has resulted in a narrower interval between wiring lines. As the narrowed interval between the wiring lines causes an increase in capacitance between the wiring lines, a request has been made for formation of an interlayer insulating film, which has a low dielectric constant.

With recent progresses in high integration of an LSI device, the wiring line has been micronized and multilayered. There has also been an increase in capacitance between the wiring lines. Such an increase in capacitance has caused a great reduction, in an operating speed. Thus, improvement in this regard has been strongly demanded. As one of improvement measures, a method for reducing capacitance between the wiring lines has been studied. This method uses an interlayer insulating film, which has a dielectric constant lower than that of $SiO_2$ currently used for an interlayer insulating film.

Typical interlayer insulating films of low dielectric constants currently under study are ① an SiOF film, and ② an organic insulating film of a low dielectric constant. Description will now be made of these films.

① SiOF Film

An SiOF film is formed by using source gas containing F and substituting Si—F bond for a portion of Si—O bond in $SiO_2$. This SiOF film has a relative dielectric constant, which is monotonically reduced as concentration of F in the film increases.

For forming such SiOF films, several methods have been reported (see p.82 of monthly periodical "Semiconductor World", February issue of 1996). Most promising among these methods is one for forming an SiOF film by using $SiH_4$, $O_2$, Ar and $SiF_4$ as source gases, and by a high-density plasma enhanced CVD method (HDPCVD method). A relative dielectric constant of an SiOF film formed by this method is in a range of 3.1 to 4.0 (varies depending on F concentration in the film). This value is lower than a relative dielectric constant 4.0 of $SiO_2$, which has conventionally been used for the interlayer insulating film.

② Organic Insulating Film of Low Dielectric Constant

As an insulating film which has a lower dielectric constant (3.0 or lower) compared with the SiOF film, an organic insulating film of a low dielectric constant is now a focus of attention. Table 1 shows a few organic insulating films of low dielectric constants, which have been reported, and respective relative dielectric constants and thermal decomposition temperatures thereof.

TABLE 1

| Organic Insulating Film | Relative Dielectric Constant | Thermal Decomposition Temperature (° C.) | Note |
|---|---|---|---|
| Fluorine-containing resin | 2.4 | 420 | p. 82 of monthly periodical "Semiconductor World", February issue of 1997 |
| Cytop | 2.1 | 400 | p. 90 of monthly periodical "Semiconductor World", February issue of 1996 |
| Amorphous telon | 1.9 | 400 | p. 91 of monthly periodical "Semiconductor World", February issue of 1996 |

However, the SiOF film is disadvantageous in that an increase in concentration of F in the film leads to a reduction in moisture absorption resistance. The reduced moisture absorption resistance poses a serious problem, because a transistor characteristic and adhesion of an upper barrier metal layer are affected.

Peeling-off easily occurs in the organic insulating film of a low dielectric constant, because of bad adhesion with a silicon wafer or the $SiO_2$ film. Furthermore, the organic insulating film is disadvantageous in that heat resistivity is low since a thermal decomposition temperature is around 400° C. The disadvantage of low heat resistivity poses a problem for annealing a wafer at a high temperature.

SUMMARY OF THE INVENTION

It is an object of the present invention to provide a method for forming an interlayer insulating film of a low dielectric constant, which has good moisture absorption resistance and heat resistivity. It is another object of the invention to provide a semiconductor device, which employs the above method.

In accordance with the method of the invention for forming an interlayer insulating film, first, porous $SiO_2$ film is formed on an object to be formed. This porous $SiO_2$ film is formed by using a Chemical Vapor Deposition method which employs source gases containing TEOS (tetraethoxy silane) and $O_3$, where the concentration of the $O_3$ is lower than that necessary for oxidizing the TEOS. Accordingly, many voids are formed in the film. In other words, porosity is provided for the $SiO_2$ film formed in this manner.

Therefore, a dielectric constant of the porous $SiO_2$ film is smaller than that of a usual $SiO_2$ film having no porosity.

In addition, a $SiO_2$ film is formed on the porous $SiO_2$ film. This $SiO_2$ film is formed by a Chemical Vapor Deposition method which employs source gases containing TEOS and $O_3$ where the concentration of the $O_3$ is sufficient for oxidizing the TEOS. Accordingly, the $SiO_2$ film fore in this manner becomes a dense $SiO_2$ film that contains no CH and OH radicals.

Therefore, since the $SiO_2$ film formed on the porous $SiO_2$ film is dense, incursion of moisture into the porous $SiO_2$ film can be prevented, and an interlayer insulating film having good moisture resistance can be formed.

Furthermore, since these $SiO_2$ films consist mainly of Si and O, these films are expected to show better heat resistivity compared to the organic insulating films of the prior art.

Secondly, in accordance with the method of the present invention for forming an interlayer insulating film, Cl (chlorine) plasma treatment is performed for the object to be formed. Accordingly, Cl (chlorine) atoms are left on some portions of the surface of the object to be formed. Subsequently, an porous $SiO_2$ film is formed on the object to be formed by a Chemical Vapor Deposition method which contains TEOS and $O_3$ as source gases. At this time, the growth of the $SiO_2$ film is prevented on some portions of the surface on which the Cl (chlorine) atoms have been left. Accordingly, many voids are, formed in the $SiO_2$ film. In other words, porosity is provided for this $SiO_2$ film formed in this manner.

Therefore, a dielectric constant of the porous $SiO_2$ film is smaller than that of a usual $SiO_2$ film having no porosity.

Furthermore, since the porous $SiO_2$ film consists mainly of Si and O, heat resistivity of the film is expected to show better heat resistively compared to the organic insulating films of the prior art.

Thirdly, in accordance with the method of the present invention for forming an interlayer insulating film, a first insulating film is formed on the porous $SiO_2$ film, which has been formed on the object to be formed, the object having been subjected to the Cl (chlorine) plasma treatment. Then, after the first insulating film is etched to be planarized, a cover insulating film is formed thereon.

In other words, by the cover insulating film, incursion of moisture into the porous $SiO_2$ film can be prevented. Therefore, it is possible to form an interlayer insulating film, which has a planarized surface and good moisture absorption resistance and heat resistivity.

Furthermore, the method for forming the foregoing porous $SiO_2$ film can be applied to a damascene process. According to the damascene process, a Cu (copper) wiring layer having small electric resistance can be formed. By combining the Cu (copper) wiring layer with the foregoing porous $SiO_2$ film, it is possible to provide a semiconductor device where a parasitic capacitance of a wiring line is small, and a data processing speed is fast.

Fourthly, in accordance with the method of the present invention for forming an interlayer insulating film, after formation of the foregoing porous $SiO_2$ film, H (hydrogen) plasma treatment is performed. Accordingly, an Si—H bond is substituted for a dangling bond of Si in an Si—O bond in the surface of the void, and the surface of the void can be made stable.

Therefore, incursion of moisture from the surface of the void can be prevented, and it is possible to form an interlayer insulating film which has good moisture absorption resistance.

DESCRIPTION OF THE PREFERRED EMBODIMENTS

Next, description will be made of the preferred embodiments of the present invention with reference to the accompanying drawings.

First Embodiment

FIGS. 1A to 1G are cross-sectional views, each of which illustrates a first embodiment of the present invention.

Figure 1A:
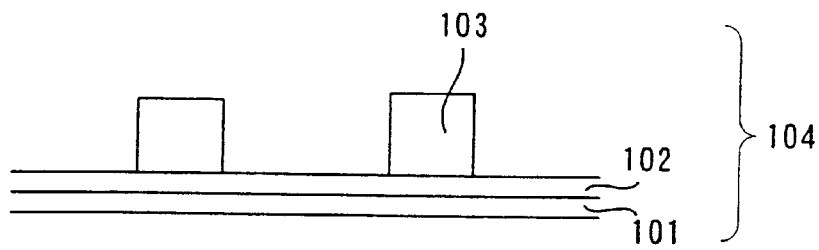
FIGS. 1A to 1G are cross-sectional views, each of which shows a method for forming an interlayer insulating film according to a first embodiment of the present invention.

First, as shown in FIG. 1A, a BPSG (borophosphosilicate glass) film 102 is formed on a silicon substrate 101. Then, after an aluminum film is formed on the BPSG film 102, an aluminum Wring layer 103 is formed by patterning the aluminum film. The silicon substrate 101, the BPSG film 102 and the aluminum wiring layer 103 formed in this manner constitute an object 104 to be formed.

Figure 1B:
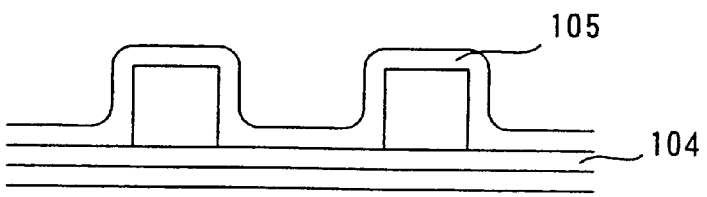

Then, as shown in FIG. 1B, an $SiO_2$ film 105 (underlying insulating film) is formed on the object 104 to be formed. This $SiO_2$ film 105 is formed by a plasma enhanced CVD method (plasma enhanced Chemical Vapor Deposition method), and $SiH_4$ and $N_2O$ are used as source gases. A film thickness of this $SiO_2$ film 105 is 100 nm.

Figure 1C:
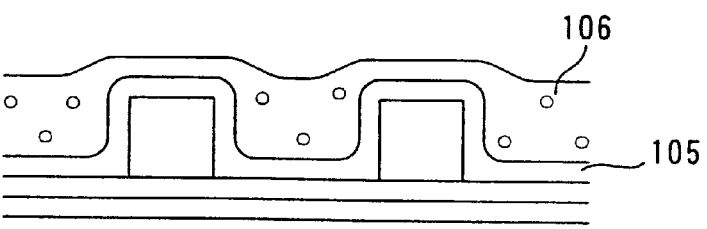

Subsequently, as shown in FIG. 1C, a porous $SiO_2$ film 106 is formed on the $SiO_2$ film 105 (underlying insulating film). This porous $SiO_2$ film 106 is formed by an atmospheric CVD method (atmospheric Chemical Vapor Deposition method). TEOS (tetraethoxy silane), $O_3$ of low concentration, and $O_2$ are contained in the source gas for the CVD method. Here, the $O_3$ of low concentration is defined as the $O_3$ having concentration that is lower than that necessary for oxidizing the TEOS. Specifically, the flow rate of the TEOS is 25 sccm and that of $O_2$ is 7.5 slm. And $O_3$ of 1~2% by flow rate ratio is contained in the $O_2$.

Furthermore, $N_2$ (nitrogen) with flow rate 1~3 slm is also contained in the source gas. And the temperature of the silicon substrate 101 is maintained at 400° C. during the formation of $SiO_2$ film 106.

Generally, in the case of the atmospheric CVD method which uses TEOS and $O_3$ as source gases, the following has been discovered for an $SiO_2$ film thereby formed. That is, as concentration of $O_3$ in the source gas is increased, oxidation of TEOS progresses faster on a wafer to form an $SiO_2$ film having flowability. Conversely, as concentration of $O_3$ is decreased, oxidation of TEOS is insufficient. Accordingly, if concentration of $O_3$ is low, many CH or OH radicals are left in an $SiO_2$ film formed on the wafer. Especially, if an underlying film is an $SiO_2$ film, an abnormal growth of an $SiO_2$ film having a rough surface occurs by employing $O_3$ of low concentration and TEOS.

The porous $SiO_2$ film 106 is formed by utilizing the aforementioned abnormal growth of the $SiO_2$ film, and many voids are formed in the film.

Figure 1D:
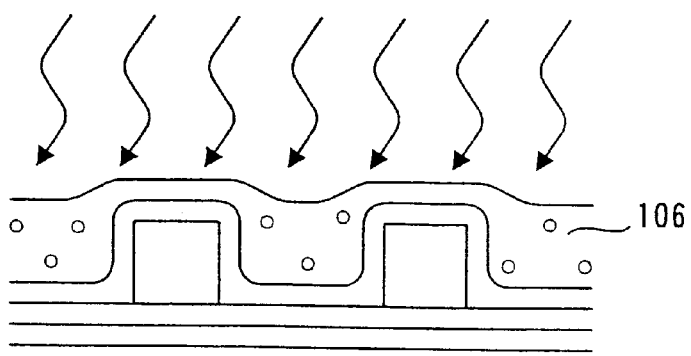

Then, as shown in FIG. 1D, H (hydrogen) plasma treatment is performed for the porous $SiO_2$ film 106.

This H plasma treatment is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~10.2 Torr and the temperature of the silicon substrate 101 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Figure 1E:
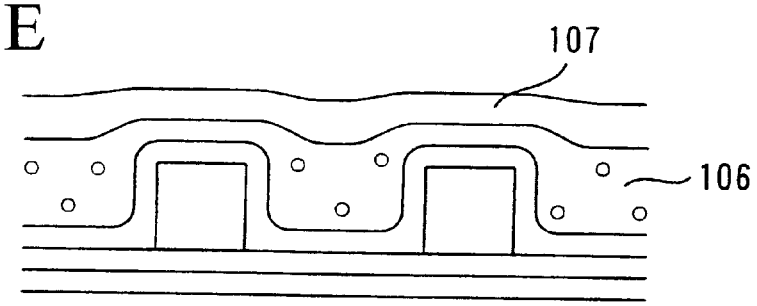

Then, as shown in FIG. 1E, an $SiO_2$ film 107 is formed on the porous $SiO_2$ film 106. This $SiO_2$ film 107 is formed by an atmospheric CVD method, for which the source gas containing $O_2$, $O_3$, and TEOS are used. At this time, a flow rate of TEOS is 25 sccm and that of $O_2$ is 7.5 slm. Further, $O_2$ contains $O_3$ of 5~6% by flow rate ratio, which is sufficient for oxidizing the TEOS. Accordingly, as described above, the $SiO_2$ film 107 has flowability. Thus, even if the $SiO_2$ film 106 formed below has convexity and concavity in the surface, the $SiO_2$ film 107 is formed to have a nearly smooth surface shape, and self-planarizing is carried out.

Furthermore, $N_2$ (nitrogen) with flow rate 1~3 is also contained in the source gas. And the temperature of the silicon substrate 101 is maintained at 400° C. during the formation of $SiO_2$ film 107.

Figure 1F:
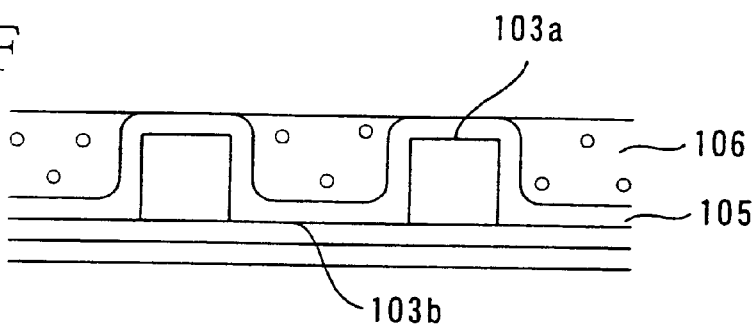

Subsequently, as shown in FIG. 1F, the $SiO_2$ film 107 and the porous $SiO_2$ film 106 formed above a convexity 103a of the aluminum wiring layer are polished to be planarized by a CMP method (Chemical Mechanical Polishing method). After completing the polishing, the $SiO_2$ film 105 (underlying insulating film) formed on the convexity 103a of the aluminum wiring layer and the porous $SiO_2$ film 106 formed in a concavity 103b of the same are exposed on the surfaces.

Figure 1G:
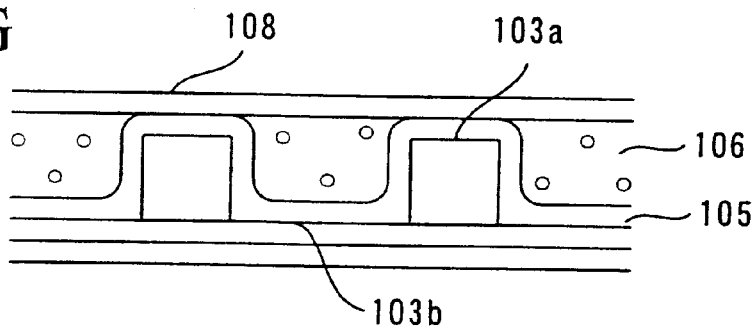

Then, as shown in FIG. 1G, an $SiO_2$ film 108 (cover insulating film) is formed on the $SiO_2$ film 105 (underlying insulating film) formed on the convexity 103a of the aluminum wiring layer and on the porous $SiO_2$ film 106 formed in the concavity 103b of the same. This $SiO_2$ film 108 is formed by the plasma enhanced CVD method. Sources gases used at this time are $SiH_4$ and $N_2O$, and a film thickness of the $SiO_2$ film 108 is 100 nm.

The foregoing process of forming the $SiO_2$ films 105 (underlying insulating film), 106 and 108 (cover insulating film) results in formation, on the object 104 to be formed, of an interlayer insulating film of a low dielectric constant, which has good heat resistivity and moisture absorption resistance. That is, the $SiO_2$ film 106 has porosity, a dielectric constant thereof is 2.0 to 3.0. This value is smaller than a dielectric constant 4.0 of a usual $SiO_2$ film. Also, since the usual $SiO_2$ film 108 is formed on the porous $SiO_2$ film 106, incursion of moisture into the $SiO_2$ film 106 can be prevented.

Further, the H plasma treatment for the $SiO_2$ film 106 can improve the moisture absorption resistance of the film 106.

Still further, the $SiO_2$ films 105, 106 and 108 have better heat resistivity compared to the organic insulating film of the prior art, because these films consist mainly of Si and O.

Second Embodiment

FIGS. 2A to 2L are cross-sectional views, each of which illustrates a second embodiment.

The second embodiment is a case of applying the first embodiment to a damascene process.

Figure 2A:
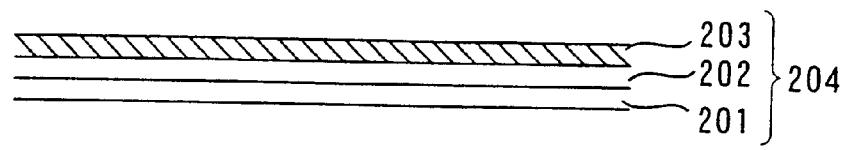
FIGS. 2A to 2L are cross-sectional views, each of which shows a method for forming an interlayer insulating film according to a second embodiment of the invention.

First, as shown in FIG. 2A, a BPSG (borophosphosilicate glass) film 202 is formed on a silicon substrate 201. After an aluminum layer is formed on the BPSG film 202, an aluminum wiring layer 203 is formed by patterning the aluminum layer. Then, the silicon substrate 201, the BPSG film 202 and the aluminum wiring layer 203 constitute an object 204 to be formed.

Figure 2B:
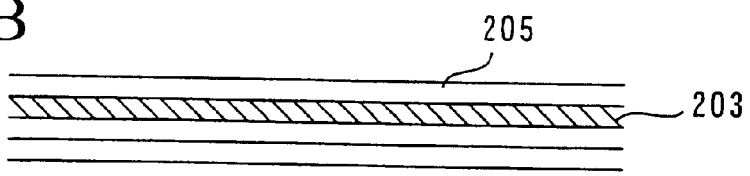

Subsequently, as shown in FIG. 2B, an $SiO_2$ film 205 (underlying insulating film) having a film thickness of 100 nm is formed on the aluminum wiring layer 203. This $SiO_2$ film 205 is formed by a plasma enhanced CVD method (plasma enhanced Chemical Vapor Deposition method), and $SiH_4$ and $N_2O$ are used as source gases.

Figure 2C:
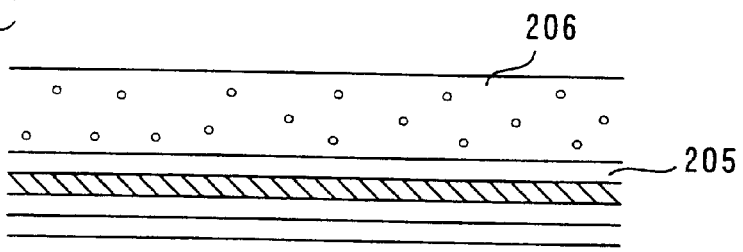

Then, as shown in FIG. 2C, an $SiO_2$ film 206 having a film thickness of 500 nm is formed on the $SiO_2$ film 205 (underlying insulating film). This $SiO_2$ film 206 is formed by an atmospheric CVD method (atmospheric Chemical Vapor Deposition method) for which the source gas containing $O_2$, $O_3$ of low concentration, and TEOS (tetraethoxy silane) are used.

Here, the $O_3$ of low concentration is defined as the $O_3$ having concentration that is lower than that necessary for oxidizing the TEOS. Specifically, the flow rate of the TEOS is 25 sccm and that of $O_2$ is 7.5 slm. And $O_3$ of 1–2% by flow rate ratio is contained in the $O_2$.

As described above in the first embodiment, since $O_3$ of low concentration is used, the $SiO_2$ film 206 is provided with porosity. Therefore, many voids are formed in the $SiO_2$ film 206.

It should be noted that $N_2$ (nitrogen) with flow rate 1~3 slm is also contained in the source gas. And the temperature of the silicon substrate 201 is maintained at 400° C. during the formation of $SiO_2$ film 206.

Figure 2D:
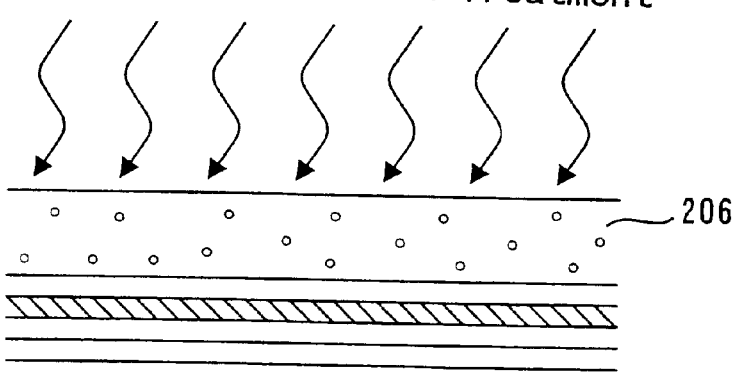

Subsequently, as shown in FIG. 2D, H (hydrogen) plasma treatment is performed for the $SiO_2$ film 206. The process condition for the H plasma treatment is the same as explained in the first embodiment. Namely, it is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 201 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Figure 2E:
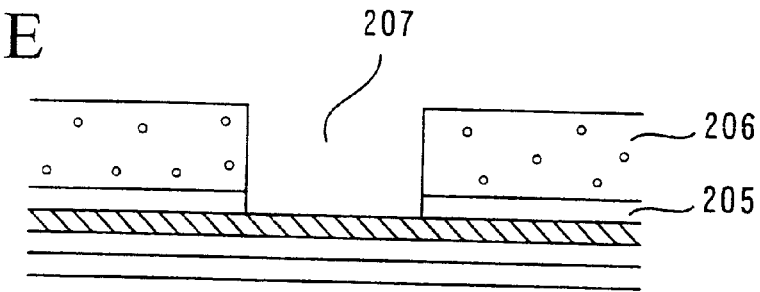

Subsequently, as shown in FIG. 2E, patterning is performed for the $SiO_2$ film 205 and 206 to form a damascene trench 207. This damascene trench 207 reaches the aluminum wiring layer 203 formed below the $SiO_2$ film 206.

Figure 2F:
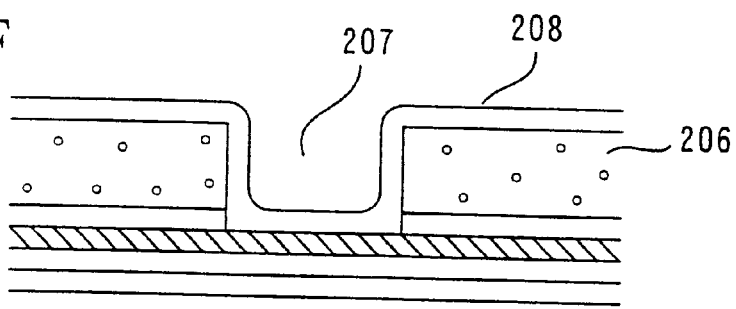

Then, as shown in FIG. 2F, an $SiO_2$ film 208 (second insulating film) is formed on the $SiO_2$ film 206 and on the side and bottom portions of the damascene trench 207. This $SiO_2$ film 208 is formed by a plasma enhanced CVD method, and $SiH_4$ and $N_2O$ are used as source gases. By the $SiO_2$ film 208 formed on the side portion of the damascene trench 207, Cu buried later in the damascene trench 207 can be prevented from being dispersed inside the porous $SiO_2$ film 206.

Figure 2G:
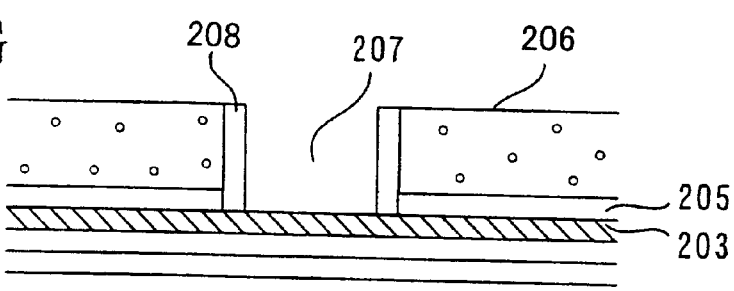

Then, as is shown in FIG. 2G, anisotropic etching is performed for the $SiO_2$ film 208 (second insulating film). While this etching eliminates the $SiO_2$ film 208 formed on the bottom portion of the damascene trench 207, the $SiO_2$ film 208 formed on the side portion of the damascene trench 207 is not eliminated in this etching. The remaining $SiO_2$ film 208 constitutes a sidewall insulating film on the side portion of the damascene trench 207.

Figure 2H:
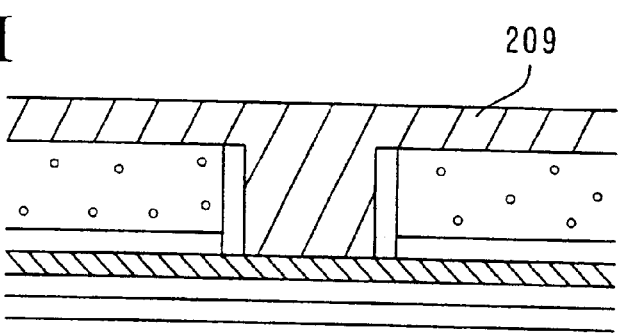

Subsequently, as shown in FIG. 2H, a Cu (copper)-plated film 209 is formed in the damascene trench 207 and on the $SiO_2$ film 206. The Cu-plated film 209 formed in the damascene trench 207 is used as a Cu wiring line.

Figure 2I:
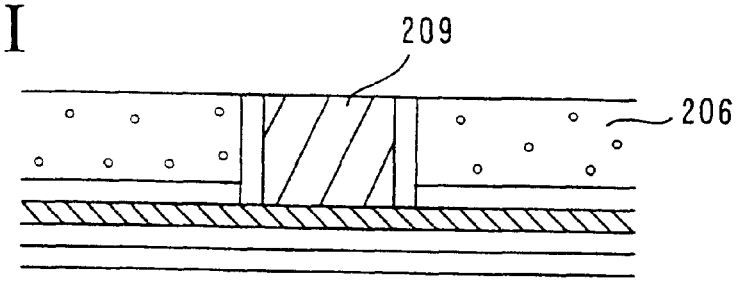

Then, as shown in FIG. 2I, the Cu-plated film 209 formed on the $SiO_2$ film 206 is polished and eliminated by a CMP method (Chemical Mechanical Polishing method). Accordingly, the Cu-plated film remains only in the damascene trench 207.

Figure 2J:
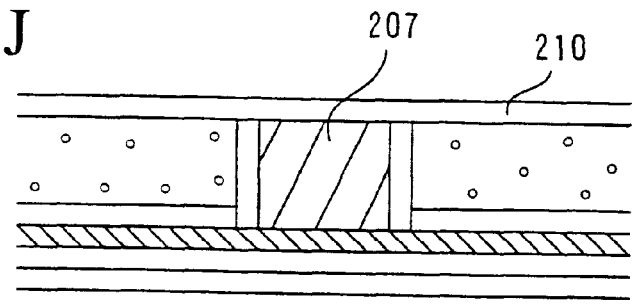

Subsequently, as shown in FIG. 2J, a barrier metal TiN film 210 is formed above the damascene trench 207. Accordingly, Cu in the damascene trench 207 can be prevented from being dispersed in an $SiO_2$ film formed later above the damascene trench 207.

Figure 2K:
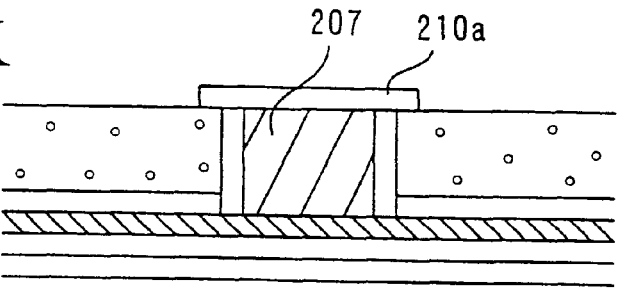

Then, as shown in FIG. 2K, patterning is performed to leave a TiN film 210a formed above the damascene trench 207, and the TiN film 210 formed in the other portions is etched to be eliminated.

Figure 2L:
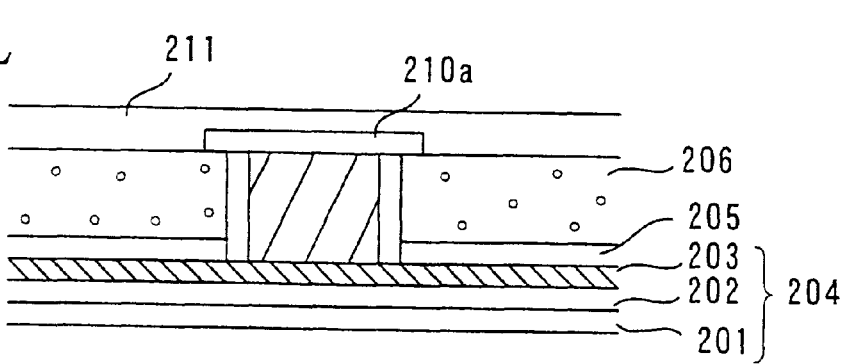

Subsequently, as shown in FIG. 2L, an $SiO_2$ film 211 (cover insulating film) is formed on the $SiO_2$ film 206 and the TiN film 210a. This $SiO_2$ film 211 is formed by a plasma enhanced CVD method, and $SiH_4$ and $N_2O$ are used as source gases.

The foregoing process results in formation, on the object 204 to be formed, of an interlayer insulating film of a low dielectric constant, which has good heat resistivity and moisture absorption resistance. That is, the $SiO_2$ film 206 has porosity, and a dielectric constant thereof is 2.0 to 3.0. This value is smiler than a dielectric constant 4.0 of a usual $SiO_2$ film. Also, since the usual $SiO_2$ film 211 (cover insulating film) is formed on the porous $SiO_2$ film 206, incursion of moisture into the $SiO_2$ film 206 can be prevented.

Further, the H plasma treatment for the $SiO_2$ film 206 can improve the moisture absorption resistance of the film 206.

Still further, the, $SiO_2$ films 206 and 211 have better heat resistivity compared to the organic insulating film of the prior art, because these films consist mainly of Si and O.

Third Embodiment

FIGS. 3A to 3I are cross-sectional views, each of which illustrates a third embodiment.

Figure 3A:
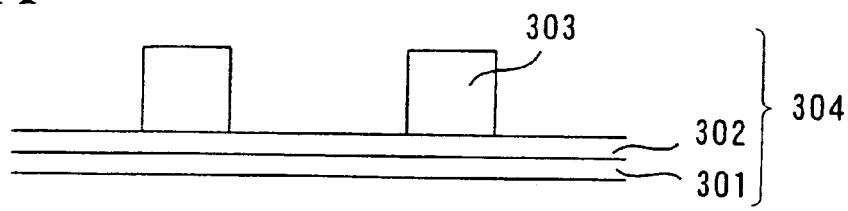
FIGS. 3A to 3I are cross-sectional views, each of which shows a method for forming an interlayer insulating film according to a third embodiment of the invention.

First, as shown in FIG. 3A, a BPSG (borophosphosilicate glass) film 302 is formed on a silicon substrate 301. Then, after an aluminum film is formed on the BPSG film 302, patterning is performed for the same to form an aluminum wiring layer 303. The silicon substrate 301, the BPSG film 302 and the aluminum wiring layer 303 formed in this manner constitute an object 304 to be formed.

Figure 3B:
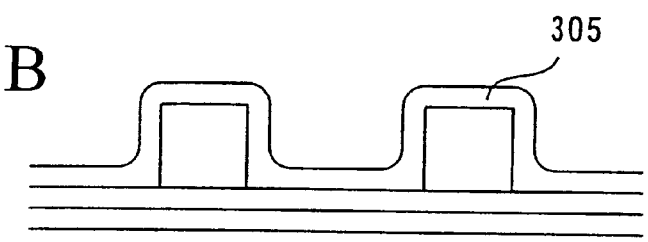

Then, as shown in FIG. 3B, an $SiO_2$ film 305 (underlying insulating film) is formed on the object 304 to be formed. This $SiO_2$ film 305 is formed by a plasma enhanced CVD method (plasma enhanced Chemical Vapor Deposition method), and $SiH_4$ and $N_2O$ are used as source gases. A film thickness of the $SiO_2$ film 305 is 100 nm.

Figure 3C:
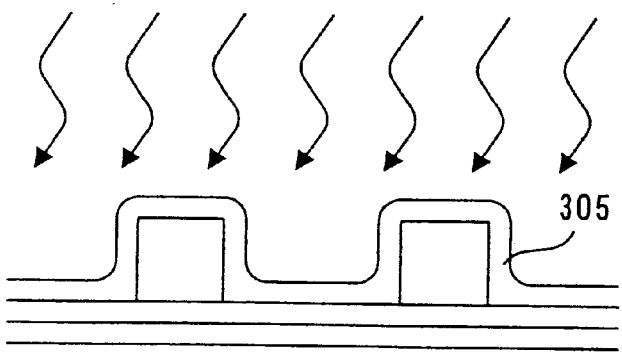

Subsequently, as shown in FIG. 3C, Cl (chlorine) plasma treatment is performed for the $SiO_2$ film 305 (underlying insulating film).

This Cl plasma treatment is performed by supplying $Cl_2$ of 600 sccm to a chamber (not shown) and applying RF power to upper and lower electrodes (not shown) that is opposing each other in the chamber. And the RF power applied to the upper electrode has frequency of 13.56 MHz and power of 100 W. On the other hand, the RF power applied to the lower electrode has frequency of 400 kHz and power of 400 W. During undergoing the Cl plasma treatment the pressure in the chamber is about 0.2 Torr and the temperature of the silicon substrate 301 is maintained at 400° C.

This Cl plasma treatment leaves Cl (chlorine) atoms on some portions of the surface of the $SiO_2$ film 305.

Figure 3D:
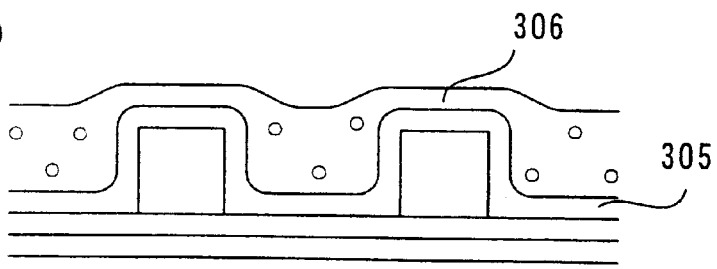

Then, as shown in FIG. 3D, an $SiO_2$ film 306 having a film thickness of 500 nm is formed on the $SiO_2$ film 305 (underlying insulating film) which has been subjected to the Cl (chlorine) plasma treatment. This $SiO_2$ film 306 is formed by an atmospheric CVD method (atmospheric Chemical Vapor Deposition method) for which the source gas containing $O_2$, $O_3$, and TEOS (tetraethoxy silane) are used. The flow rate of the TEOS is 25 sccm and that of $O_2$ is 7.5 slm. And $O_3$ of 4–6% by flow rate ratio is contained in the $O_2$. Further, the source gas contains $N_2$ (nitrogen) of flow rate 1–3 slm. Still further, during the formation of the $SiO_2$ film 306 the temperature of the silicon substrate 301 is maintained at 400° C.

At this time, the $SiO_2$ film 306 is prevented from being grown on the portion of the surface of the $SiO_2$ film 305 where Cl (chlorine) has been left. Accordingly, many voids are formed in the $SiO_2$ film 306 to provide porosity for the same.

Figure 3E:
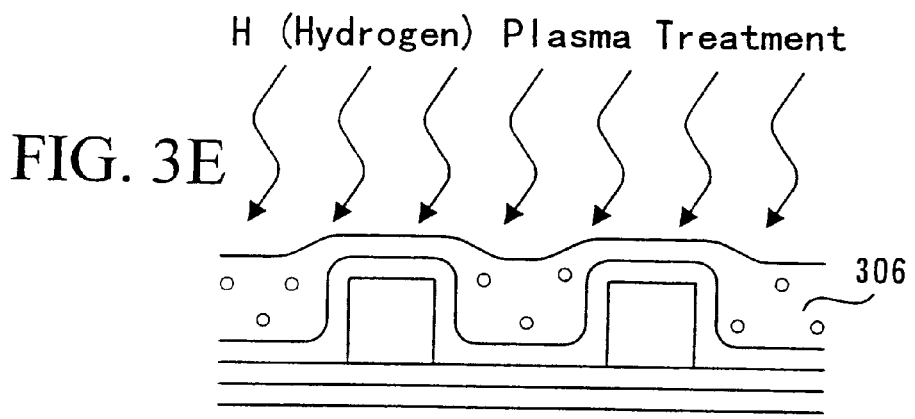

Subsequently, as shown in FIG. 3E, H (hydrogen) plasma treatment is performed for the porous $SiO_2$ film 306.

The process condition for the H plasma treatment is the same as explained in the first and second embodiment. Namely, it is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and, power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 301 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Figure 3F:
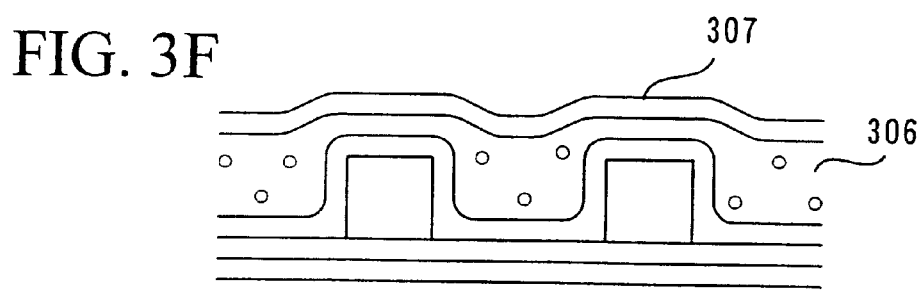

Subsequently, as shown in FIG. 3F, an $SiO_2$ film 307 is formed on the porous $SiO_2$ film 306. This $SiO_2$ film 307 is formed by a plasma enhanced CVD method.

Figure 3G:
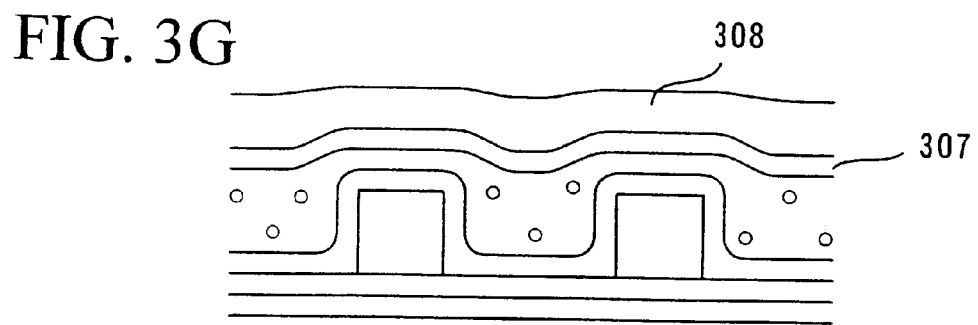

Then, as shown in FIG. 3G, an $SiO_2$ film 308 (first insulating film) having a film thickness of 200 nm is formed on the $SiO_2$ film 307. This $SiO_2$ film 308 is formed by an atmospheric CVD method, for which the source gas containing $O_2$, $O_3$, and TEOS are used. Since the concentration of $O_3$ in the source gas at this time is higher than usual, flowability is provided for the $SiO_2$ film 308. Accordingly, even if the surface of the $SiO_2$ film 307 formed below has convexity and concavity, the $SiO_2$ film 308 is formed to have a nearly planarized surface, and self-planarizing is carried out.

In this case, by the previously formed $SiO_2$ film 307, the $SiO_2$ film 308 having flowability can be prevented from entering the void of the porous $SiO_2$ film 306.

Figure 3H:
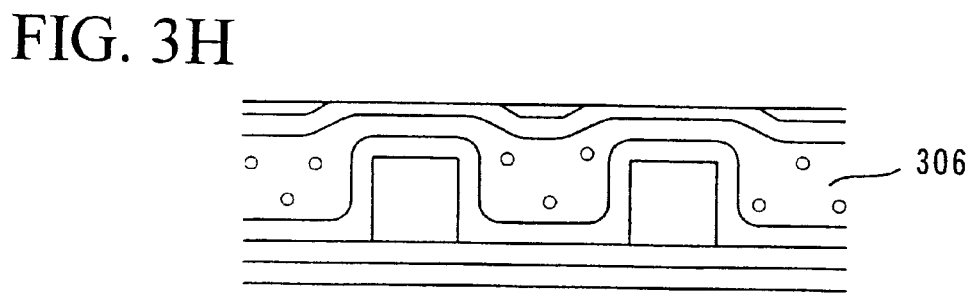

Subsequently, as shown in FIG. 3H, in order for planarizing the surface, etching is performed for the $SiO_2$ films 307 and 308 (first insulating film). This etching should be carried out not to result in complete elimination of the $SiO_2$ film 308.

Figure 3I:
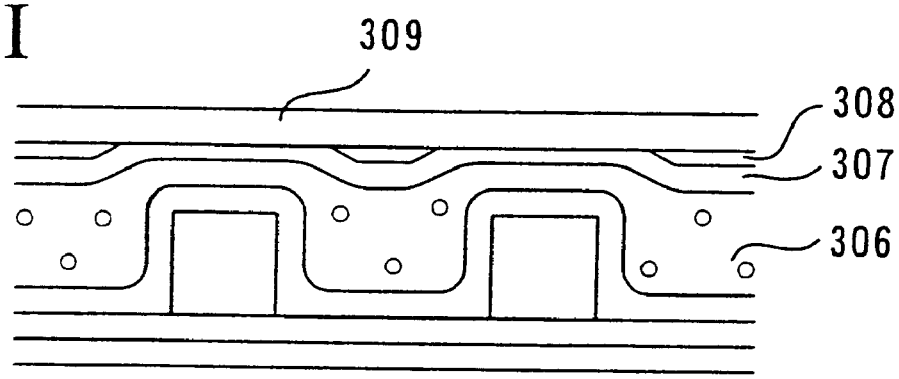

Then, as shown in FIG. 3I, an $SiO_2$ film 309 (cover insulating film) is formed on the remaining $SiO_2$ films 307 and 308 (first insulating film), i.e., the portions of the films remaining without being eliminated by etching. This $SiO_2$ film 309 is formed by a plasma enhanced CVD method, and a film thickness thereof is 100 nm.

The foregoing process of forming the $SiO_2$ films 305 (underlying insulating film), 306, 307, 308 (first insulating film) and 309 (cover insulating film) results in formation, on the object 304 to be formed, an interlayer insulating film of a low dielectric constant, which has good heat resistivity and moisture absorption resistance. That is, the $SiO_2$ film 306 has porosity, and a dielectric constant thereof is 2.0 to 3.0. This value is smaller than a dielectric constant 4.0 of a usual $SiO_2$ film.

Further, the H plasma treatment for the $SiO_2$ film 306 can improve the moisture absorption resistance of the film 306.

Also, since the usual $SiO_2$ films 307, 308 and 309 are formed on the porous $SiO_2$ film 306, incursion of moisture into the $SiO_2$ film 306 can be prevented.

Moreover, the $SiO_2$ films 305, 306, 307, 308, and 309 have better heat resistivity compared to the organic insulating film of the prior art, because these films consist mainly of Si and O.

Fourth Embodiment

A fourth embodiment is a case of applying the third embodiment to a damascene process.

Figure 4A:
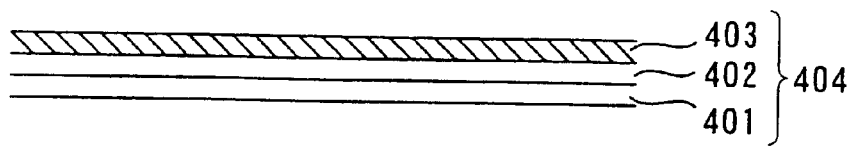
FIGS. 4A to 4N are cross-sectional views, each of which shows a method for forming an interlayer insulating film according to a fourth embodiment of the invention.
Figure 4B:
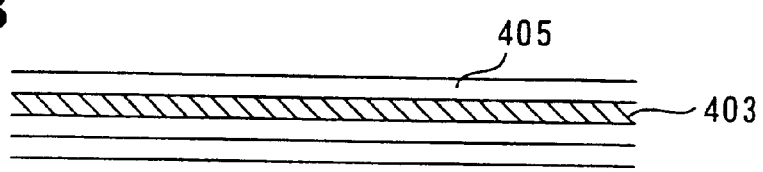
Figure 4C:
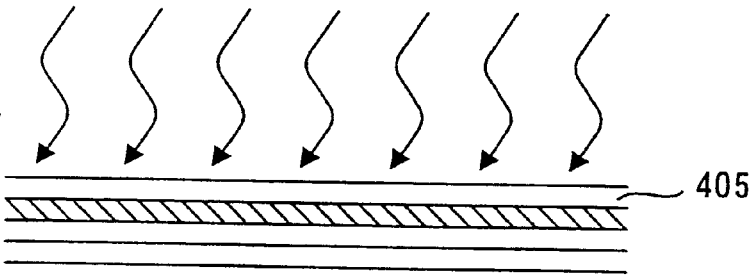
Figure 4D:
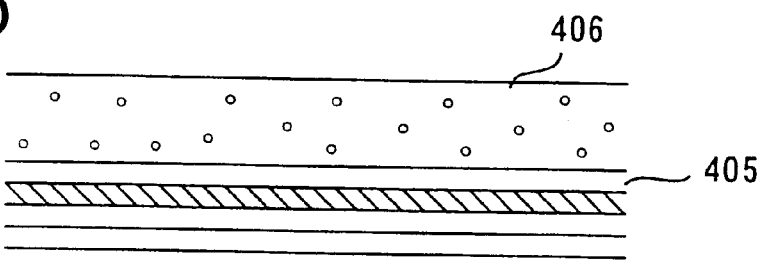
Figure 4E:
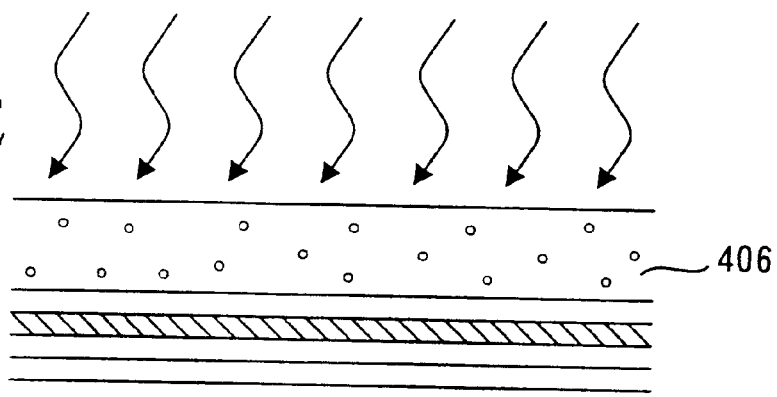
Figure 4F:
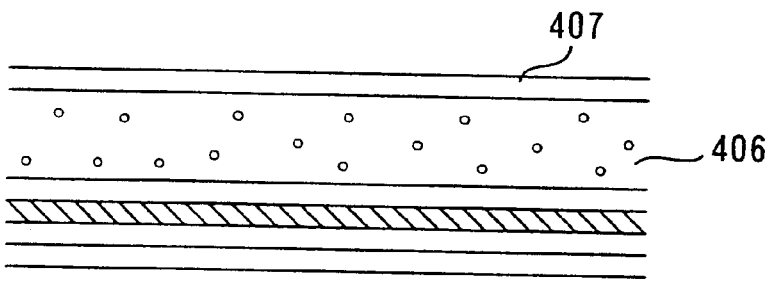
Figure 4G:
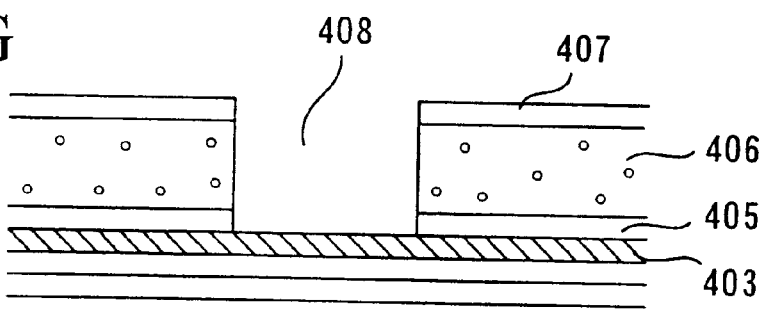
Figure 4H:
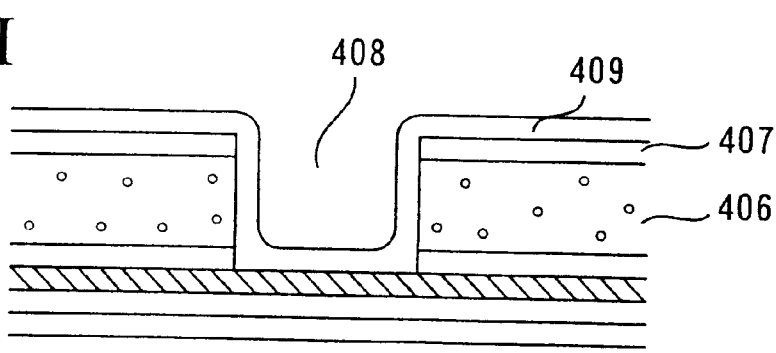
Figure 4I:
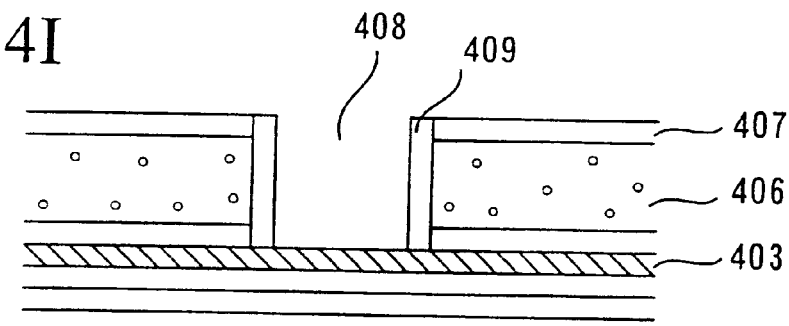
Figure 4J:
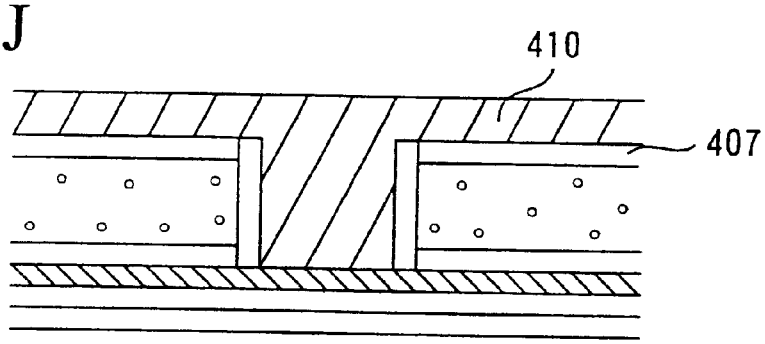
Figure 4K:
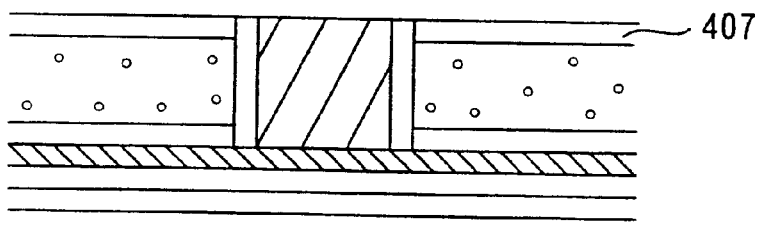
Figure 4L:
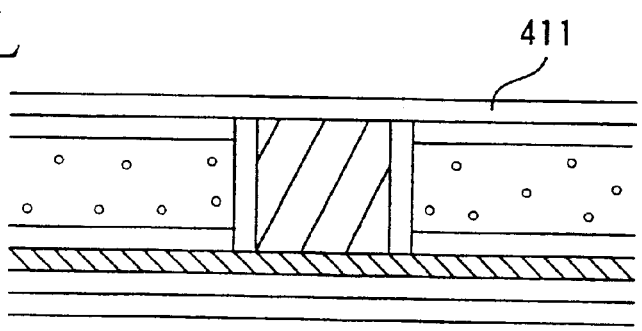
Figure 4M:
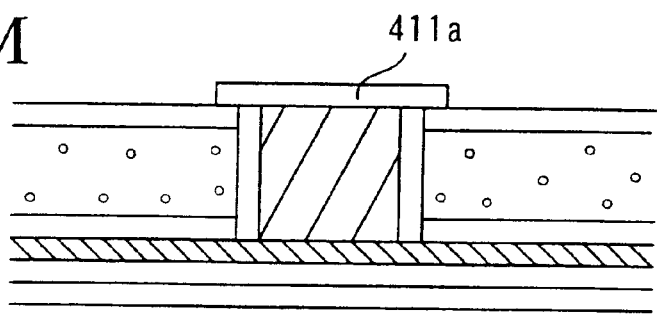
Figure 4N:
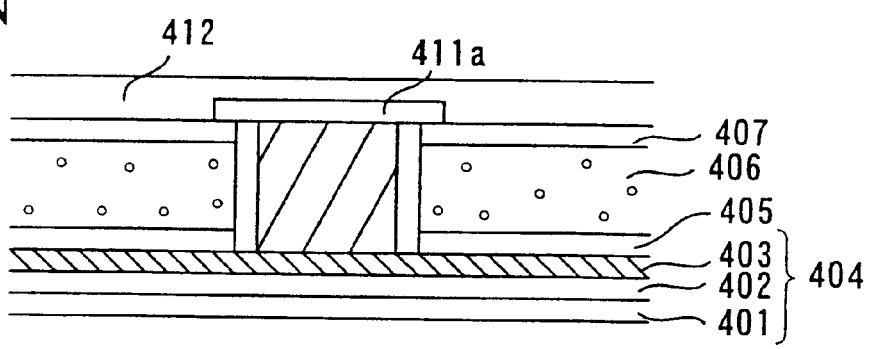

FIGS. 4A to 4N are cross-sectional views, each of which illustrates the fourth embodiment.

First, as shown in FIG. 4A, a BPSG (borophosphosilicate glass) film 402 is formed on a silicon substrate 401. Then, after an aluminum layer is formed on the BPSG film 402, patterning is performed for the aluminum layer to form an aluminum wiring layer 403. The silicon substrate 401, the BPSG film 402 and the aluminum wiring layer 403 constitute an, object 404 to be formed.

Subsequently, as shown in FIG. 4B, an $SiO_2$ film 405 (underlying insulating film) having a film thickness of 100 nm is formed on the aluminum wiring layer 403. This $SiO_2$ film 405 is formed by a plasma enhanced CVD method (plasma enhanced Chemical Vapor Deposition method), and $SiH_4$ and $N_2O$ are used as source gases.

Then, as shown in FIG. 4C, Cl (chlorine) plasma treatment is performed for the $SiO_2$ film 405 (underlying insulating film).

This Cl plasma treatment is performed by supplying $Cl_2$ of 600 sccm to a chamber (not shown) and applying RF power to upper and lower electrodes (not shown) that is opposing each other in the chamber. And the RF power applied to the upper electrode has frequency of 13.56 MHz and power of 100 W. On the other hand, the RF power applied to the lower electrode has frequency of 400 kHz and power of 400 W. During undergoing the cl plasma treatment the pressure in the chamber is about 0.2 Torr and the temperature of the silicon substrate 401 is maintained at 400° C.

This Cl plasma treatment leaves Cl (chlorine) atoms on some portions of the surface of the $SiO_2$ film 405.

Then, as shown in FIG. 4D, an $SiO_2$ film 406 having a film thickness of 500 nm is formed on the $SiO_2$ film 405 (underlying insulating film) which has been subjected to the Cl (chlorine) plasma treatment. This $SiO_2$ film 406 is formed by an atmospheric CVD method (atmospheric Chemical Vapor Deposition method), for which the source gas containing $O_2$, $O_3$, and TEOS (tetraethoxy silane) are used. The flow rate of the TEOS is 25 sccm and that of $O_2$ is 7.5 slm. And $O_3$ of 4–6% by flow rate ratio is contained in the $O_2$. Further, the source gas contains $N_2$ (nitrogen) of flow rate 1–3 slm. Still further, during the formation of the $SiO_2$ film 406 the temperature of the silicon substrate 401 is maintained at 400° C.

At this time, the $SiO_2$ film 406 is prevented from being grow on the portions of the surface of the $SiO_2$ film 405 where Cl (chlorine) has been left. Accordingly, many voids are formed in the $SiO_2$ film 406, and porosity is provided for the $SiO_2$ film 406.

Then, as shown in FIG. 4E, H (hydrogen) plasma treatment is performed for the porous $SiO_2$ film 406.

The process condition for the H plasma treatment is the same as explained in the first to third embodiment. Namely, it is performed by supplying $H_2$ of 600 sccm to a chamber (not shown) and applying RF power to upper and lower electrodes (not shown) that is opposing each other in the chamber. And the RF power applied to the upper electrode has frequency of 13.56 MHz and power of 50 W. On the other hand, the RF power applied to the lower electrode has frequency of 400 kHz and power of 400 W. Further, during undergoing the H plasma treatment, the pressure in the chamber is 0.1~0.2 Torr and the temperature of the silicon substrate 401 is maintained at 400° C. Still further, the time for the H plasma treatment is 60 sec.

The H plasma treatment substitutes Si—H bonds for dangling bonds of Si in an Si—O bond in the surface of the void. Therefore, OH radicals and water are made to be hard to bond to the dangling bonds of Si, which improves the moisture absorption resistance of the film.

Then, as shown in FIG. 4F, an $SiO_2$ film 407 is formed on the $SiO_2$ film 406. This $SiO_2$ film 407 is formed by a plasma enhanced CVD method, and $SiH_4$ and $N_2O$ are used as source gases. By this $SiO_2$ film 407, Cu of a Cu-plated film formed later on the $SiO_2$ film 407 can be prevented from being dispersed in the porous $SiO_2$ film 406.

Subsequently, as shown in FIG. 4G, patterning is performed for the $SiO_2$ films 405 (underlying insulating film), 406 and 407 to form a damascene trench 408. This damascene trench 408 reaches the aluminum wiring layer 403 formed below the $SiO_2$ film 405.

Then, as shown in FIG. 4H, an $SiO_2$ film 409 (second insulating film) is formed on the $SiO_2$ film 407 and on the side and bottom portions of the damascene trench 408. This $SiO_2$ film 409 is formed by a plasma enhanced CVD method. By the $SiO_2$ film 409 formed on the side portion of the damascene trench 408, Cu buried later in the damascene trench 408 can be prevented from being dispersed in the porous $SiO_2$ film 406.

Then, as shown in FIG. 4I, anisotropic etching is performed for the $SiO_2$ film 409 (second insulating film). Accordingly, the $SiO_2$ film 409 is eliminated except for the portion formed on the side portion of the damascene trench 408, and a contact hole reaching the aluminum wiring layer 403 is formed in the lower portion of the damascene trench 408. And the $SiO_2$ film 409 remaining on the side portion of the damascene trench 408 constitutes a sidewall insulating film. The $SiO_2$ film 407 is not eliminated by this etching and is left on the porous $SiO_2$ film 406.

Subsequently, as shown in FIG. 4J, a Cu-plated film 410 is formed in the damascene trench 408 and on the $SiO_2$ film 407. The Cu-plated film 410 formed in the damascene trench 408 is used as a Cu wiring line.

Then, as shown in FIG. 4K, the Cu-plated film 410 formed on the $SiO_2$ film 407 is polished and eliminated by a CMP method. Accordingly, the Cu-plated film 410 remains only in the damascene trench 408.

Subsequently, as shown in FIG. 4L, a barrier metal TiN film 411 is formed above the damascene trench 408. Accordingly, Cu in the damascene trench 408 can be prevented from being dispersed in an $SiO_2$ film later formed above the same.

Then, as shown in FIG. 4M, patterning is performed to leave a TiN film 411a formed above the damascene trench 408, and the TiN film 411 formed in the other portions is etched to be eliminated.

Subsequently, as shown in FIG. 4N, an $SiO_2$ film 412 (cover insulating film) is formed on the $SiO_2$ film 407 and the TiN film 411a. This $SiO_2$ film 412 is formed by a plasma enhanced CVD method, and $SiH_4$ and $N_2O$ are used as source gases.

The foregoing process results in formation, on the object 404 to be formed, an interlayer insulating film of a low dielectric constant, which has good heat resistivity and moisture absorption resistance. That is, the $SiO_2$ film 406 has porosity, and a dielectric constant thereof is 2.0 to 3.0. This value is smaller than a dielectric constant 4.0 of a usual $SiO_2$ film.

Further, the H plasma treatment for the $SiO_2$ film 406 can improve the moisture absorption resistance of the film 406.

Also, since the usual $SiO_2$ films 407 and 412 (cover insulating film) are formed on the porous $SiO_2$ film 406, incursion of moisture into the $SiO_2$ film 406 can be prevented.

Moreover, the $SiO_2$ films 406, 407, and 412 have better heat resistivity compared to the organic insulating film of the prior art, because these films consist mainly of Si and O.

What is claimed is:

1. A method for forming an interlayer insulating film in a semiconductor device, comprising the steps of:

forming a porous $SiO_2$ film on a substrate by a Chemical Vapor Deposition that employs a source gas containing TEOS and $O_3$, wherein the $O_3$ is contained in the source gas in a first concentration that is lower than a second concentration necessary for oxidizing the TEOS; and forming a dense insulating film over said porous $SiO_2$ film.

2. A method for forming an interlayer insulating film in a semiconductor device, comprising the steps of:

forming an underlying insulating film on a substrate;

forming a porous $SiO_2$ film on said underlying insulating film by Chemical Vapor Deposition that employs a source gas containing TEOS and $O_3$, wherein the $O_3$ is contained in the source gas in a first concentration that is lower than a second concentration necessary for oxidizing the TEOS; and forming a dense insulating film over said porous $SiO_2$ film.

3. A method for forming an interlayer insulating film according to claim 1, wherein said dense insulating film is a $SiO_2$ film which is formed on said porous film by a Chemical Vapor Deposition that employs a source gas containing TEOS and $O_3$, wherein the $O_3$ is contained in the source gas in said second concentration that is sufficient for oxidizing the TEOS.

4. A method according to claim 3, wherein after formation of said $SiO_2$ film on said porous $SiO_2$ film, a surface of said $SiO_2$ film is polished to be planarized by a CMP method (Chemical Polishing method).

5. A method according to claim 4, wherein after the surface is polished to be planarized by the CMP method (Chemical Mechanical Polishing Method), said dense insulating film is formed on said surface.

6. A method for forming an interlayer insulating film, comprising the steps of:

contacting a substrate with a Cl (chlorine) plasma; and forming a porous $SiO_2$ film on said surface by a Chemical Vapor deposition that employs a source gas containing TEOS (tetraethoxy silane) and $O_3$.

7. A method for forming an interlayer insulating film, comprising the steps of:

forming an underlying insulating film on a substrate;

contacting said underlying insulating film with a chlorine plasma; and forming a porous $SiO_2$ film on said underlying insulating film by a Chemical Vapor Deposition that employs a source gas containing TEOS (tetraethoxy silane) and $O_3$.

8. A method according to claim 6, further comprising the step of:

after formation of said porous $SiO_2$ film, forming a first insulating film on the porous $SiO_2$ film by a Chemical Vapor deposition that employs source gas containing TEOS (tetraethoxy silane) and $O_3$; and etching a surface of said first insulating film so as to planarize said surface.

9. A method according to claim 8, wherein after planarizing said surface of said first insulating film, a cover insulating film is formed on said first insulating film.

10. A method for forming an interlayer insulating, film, comprising the steps of:

forming a porous $SiO_2$ film on a substrate by a Chemical Vapor Deposition that employs a source gas containing TEOS (tetraethoxy silane) and $O_3$, wherein the $O_3$ is contained in the source gas at a first concentration that is lower than a second concentration necessary for oxidizing the TEOS;

forming a damascene trench in said porous $SiO_2$ film wherein the damascene trench reaches said substrate;

forming a side wall insulating film on a side portion of said damascene trench;

burying a metallic film in said damascene trench; and forming a barrier metal film on said metallic film.

11. A method for forming an interlayer insulating film, comprising the steps of:

forming an underlying insulating film on a substrate;

forming a porous $SiO_2$ film on said underlying insulating film by a Chemical Vapor Deposition that employs a source gas containing TEOS (tetraethoxy silane) and $O_3$ wherein the $O_3$ is contained in the source gas in a first concentration that is lower than a second concentration necessary for oxidizing the TEOS;

forming a damascene trench in said underlying insulating film and said porous $SiO_2$ film wherein the damascene trench reaches said substrate;

forming a side wall insulating film on a side portion of said damascene trench;

burying a metallic film in said damascene trench; and forming a barrier metal film on said metallic film.

12. A method for forming an interlayer insulating film, comprising the steps of:

contacting a substrate with a Cl (chlorine) plasma;

forming a porous $SiO_2$ film on said substrate by a Chemical Vapor Deposition that employs a source gas containing TEOS (tetraethoxy silane) and $O_3$;

forming a damascene trench in said porous $SiO_2$ film wherein the damascene trench reaches said substrate;

forming a side wall insulating film on a side portion of said damascene trench;

burying a metallic film in said damascene trench; and forming a barrier metal film on said metallic film.

13. A method for forming an interlayer insulating film, comprising the steps of:

forming an underlying insulating film on a substrate;

contacting said underlying insulating film with a Cl (chlorine) plasma;

forming a porous $SiO_2$ film on said underlying insulating film by a Chemical Vapor Deposition that employs a source gas containing TEOS (tetraethoxy silane) and $O_3$;

forming a damascene trench in said underlying insulating film and said porous $SiO_2$ film to reach said substrate;

forming a side wall insulating film in a side portion of said damascene trench;

burying a metallic film in said damascene trench; and forming a barrier metal film on said metallic film.

14. A method according to claim 10, wherein said side wall insulating film is formed by forming a second insulating film on said porous $SiO_2$ film and on side and bottom portions of said damascene trench after formation of said damascene trench, and performing anisotropic etching for said second insulating film to leave a portion of the same formed on the side portion of said damascene trench and exposing a surface of said substrate in the lower portion of said damascene trench.

15. A method according to claim 10, wherein after formation of said barrier metal film, a cover insulating film is formed on said porous $SiO_2$ film and said barrier metal film.

16. A method according to claim 1, wherein after formation of said porous $SiO_2$ film, H (hydrogen) plasma treatment is performed for the s $SiO_2$ film.

17. A method for forming an interlayer insulating film according to claim 2, wherein said dense insulating film is a $SiO_2$ film which is formed on said porous film by a Chemical Vapor Deposition that employs a source gas containing TEOS and $O_3$, wherein the $O_3$ is contained in the source gas in said second concentration that is sufficient for oxidizing the TEOS.

18. A method for forming an interlayer insulating film according to claim 1, wherein said porous $SiO_2$ film has a dielectric constant of 2.0 to 3.0 and wherein said dense insulating film is an $SiO_2$ film has a dielectric constant of 4.0.

19. A method for forming an interlayer insulating film according to claim 2, wherein said porous $SiO_2$ film has a dielectric constant of 2.0 to 3.0 and wherein said dense insulating film is an $SiO_2$ film has a dielectric constant of 4.0.

* * * * *

UNITED STATES PATENT AND TRADEMARK OFFICE
CERTIFICATE OF CORRECTION

PATENT NO. : 6,524,972 B1
DATED : February 25, 2003
INVENTOR(S) : Maeda

It is certified that error appears in the above-identified patent and that said Letters Patent is hereby corrected as shown below:

Column 1,
Line 22, "reduction," should read -- reduction --.

Column 3,
Line 9, "are," should read -- are --.

Column 4,
Line 7, "Wring" should read -- wiring --; and
Line 58, "0.1~10.2" should read -- 0.1~0.2 --.

Column 7,
Line 24, "smiler" should read -- smaller --; and
Line 31, "the," should read -- the --.

Column 8,
Line 27, "and," should read -- and --.

Column 9,
Line 31, "an," should read -- an --.

Column 10,
Line 2, "grow" should read -- grown --.

Column 11,
Line 61, after "Chemical" insert -- Mechanical --.

Column 12,
Line 26, "insulating," should read -- insulating --.

UNITED STATES PATENT AND TRADEMARK OFFICE
CERTIFICATE OF CORRECTION

PATENT NO. : 6,524,972 B1
DATED : February 25, 2003
INVENTOR(S) : Maeda

It is certified that error appears in the above-identified patent and that said Letters Patent is hereby corrected as shown below:

Column 14,
Line 6, "s" should read -- porous --.

Signed and Sealed this

First Day of July, 2003

JAMES E. ROGAN
*Director of the United States Patent and Trademark Office*